United States Patent
Hung et al.

(10) Patent No.: US 9,502,530 B2
(45) Date of Patent: Nov. 22, 2016

(54) METHOD OF MANUFACTURING SEMICONDUCTOR DEVICES

(71) Applicant: UNITED MICROELECTRONICS CORP., Hsin-Chu (TW)

(72) Inventors: Yu-Hsiang Hung, Tainan (TW); Chung-Fu Chang, Tainan (TW); Chia-Jong Liu, Ping-Tung County (TW); Yen-Liang Wu, Taipei (TW); Pei-Yu Chou, Tainan (TW); Home-Been Cheng, Keelung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/935,441

(22) Filed: Nov. 8, 2015

(65) Prior Publication Data

US 2016/0064521 A1    Mar. 3, 2016

Related U.S. Application Data

(62) Division of application No. 13/802,542, filed on Mar. 13, 2013, now Pat. No. 9,214,395.

(51) Int. Cl.
| | |
|---|---|
| *H01L 21/336* | (2006.01) |
| *H01L 29/66* | (2006.01) |
| *H01L 21/8238* | (2006.01) |
| *H01L 29/78* | (2006.01) |
| *H01L 21/225* | (2006.01) |
| *H01L 21/311* | (2006.01) |

(Continued)

(52) U.S. Cl.
CPC ..... *H01L 29/66553* (2013.01); *H01L 21/2253* (2013.01); *H01L 21/31133* (2013.01); *H01L 21/823807* (2013.01); *H01L 21/823814* (2013.01); *H01L 29/1054* (2013.01); *H01L 29/41775* (2013.01); *H01L 29/6656* (2013.01); *H01L 29/66636* (2013.01); *H01L 29/7834* (2013.01); *H01L 29/7847* (2013.01); *H01L 29/7848* (2013.01); *H01L 29/165* (2013.01); *H01L 29/665* (2013.01); *H01L 29/66545* (2013.01)

(58) Field of Classification Search
CPC ...................................................... H01L 21/336
See application file for complete search history.

(56) References Cited

U.S. PATENT DOCUMENTS

| | | | |
|---|---|---|---|
| 6,855,607 | B2 | 2/2005 | Achuthan |
| 7,013,446 | B2 | 3/2006 | Ohba |

(Continued)

FOREIGN PATENT DOCUMENTS

| | | |
|---|---|---|
| CN | 1941329 A | 4/2007 |

OTHER PUBLICATIONS

Chang, Chung-Fu et al., "New L20 Epi process for Si loss improvement", Invention disclosure, Aug. 21, 2012, p. 1-15.

*Primary Examiner* — Marvin Payen
(74) *Attorney, Agent, or Firm* — Winston Hsu; Scott Margo

(57) ABSTRACT

A method of manufacturing a semiconductor device including the steps of providing a substrate having first type semiconductor regions and second type semiconductor regions, forming a conformal first epitaxy mask layer on the substrate, forming first type epitaxial layer in the substrate of the first type semiconductor regions, forming a conformal second epitaxy mask layer on the substrate, forming second type epitaxial layer in the substrate of the second type semiconductor regions, and removing the second epitaxy mask layer.

6 Claims, 6 Drawing Sheets

(51) Int. Cl.
 *H01L 29/10* (2006.01)
 *H01L 29/417* (2006.01)
 *H01L 29/165* (2006.01)

(56) References Cited

U.S. PATENT DOCUMENTS

| | | |
|---|---|---|
| 7,112,495 B2 | 9/2006 | Ko |
| 7,250,658 B2 | 7/2007 | Doris |
| 7,335,545 B2 | 2/2008 | Currie |
| 7,521,324 B2 | 4/2009 | Ohmi |
| 7,531,437 B2 | 5/2009 | Brask |
| 7,592,270 B2 | 9/2009 | Teo |
| 2007/0015365 A1 | 1/2007 | Chen |
| 2007/0072376 A1 | 3/2007 | Chen |
| 2007/0218661 A1 | 9/2007 | Shroff |
| 2008/0061366 A1 | 3/2008 | Liu |
| 2008/0237732 A1* | 10/2008 | Mori ............... H01L 21/82380 257/371 |
| 2009/0057759 A1 | 3/2009 | Obradovic |
| 2009/0124097 A1 | 5/2009 | Cheng |
| 2009/0200494 A1 | 8/2009 | Hatem |
| 2010/0044783 A1 | 2/2010 | Chuang |
| 2010/0048027 A1 | 2/2010 | Cheng |
| 2010/0129994 A1 | 5/2010 | Awad |
| 2011/0070701 A1 | 3/2011 | Ning |
| 2012/0181625 A1 | 7/2012 | Kwok |
| 2012/0244694 A1 | 9/2012 | Shinohara |
| 2012/0309171 A1 | 12/2012 | Lu |

\* cited by examiner

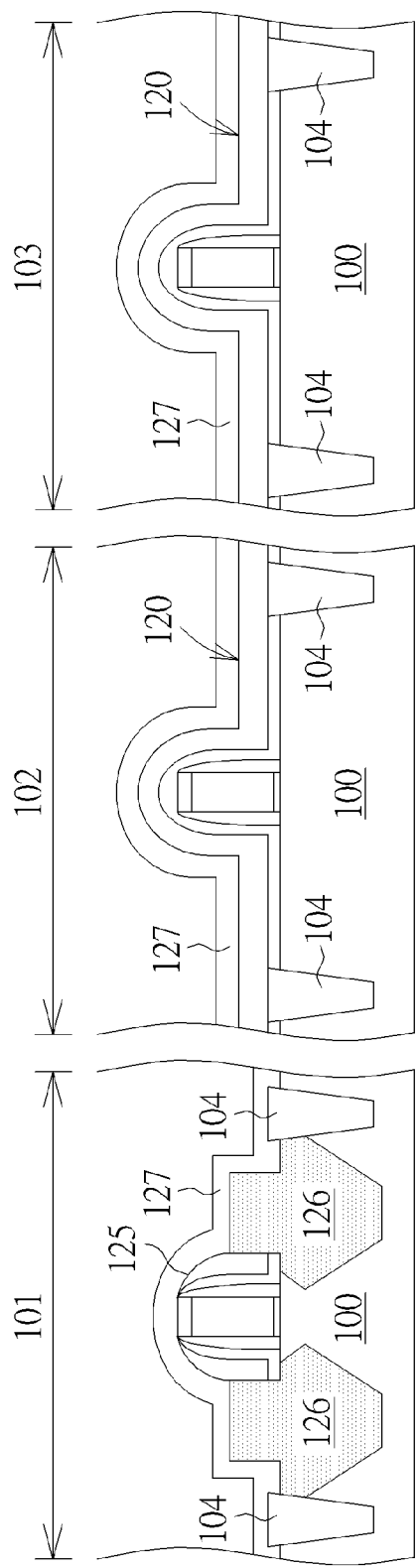
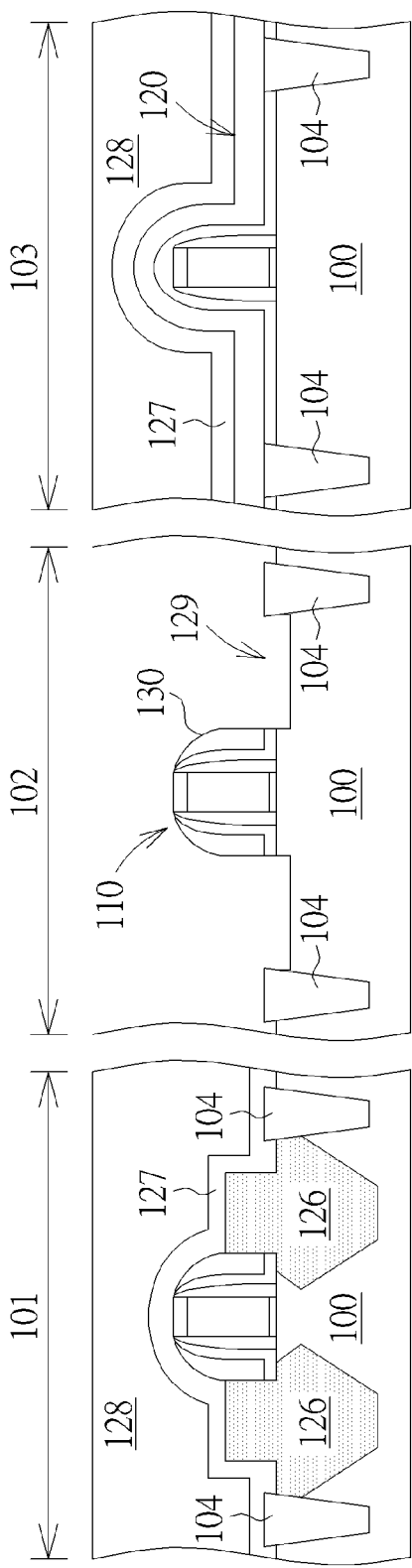
FIG. 5
FIG. 6

METHOD OF MANUFACTURING SEMICONDUCTOR DEVICES

CROSS REFERENCE TO RELATED APPLICATIONS

This application is a divisional application of and claims the benefit of U.S. patent application Ser. No. 13/802,542, filed Mar. 13, 2013.

BACKGROUND OF THE INVENTION

1. Field of the Invention

The present invention relates generally to a method of manufacturing semiconductor devices, and more particularly, to a method of manufacturing metal-oxide-semiconductor (MOS) devices.

2. Description of the Prior Art

A conventional MOS transistor generally includes a semiconductor substrate, such as silicon, a source region, a drain region, a channel positioned between the source region and the drain region, and a gate located above the channel. The gate structure is composed of a gate dielectric layer, a gate conductive layer positioned on the gate dielectric layer, and spacers positioned on the sidewalls of the gate conductive layer. Generally, for a given electric field across the channel of a MOS transistor, the amount of current that flows through the channel is directly proportional to a mobility of the carriers in the channel. Therefore, how to improve the carrier mobility in order to increase the speed performance of MOS transistors with available process tools has become a major topic in the semiconductor field.

The formation of, for example, SiGe source/drain regions, is commonly achieved by epitaxially growing a SiGe epitaxial layer adjacent to the spacers in the epitaxy recess within the semiconductor substrate after forming the spacer. In this type of MOS transistor, a biaxial tensile strain is induced in the epitaxial silicon layer due to the silicon germanium, which has a larger lattice constant than silicon, and, as a result, the band structure is modified, and the carrier mobility increases. This enhances the speed performance of the PMOS transistor. Similarly, SiC source/drain regions may be used to enhance the speed performances of the NMOS transistor.

In conventional strained silicon transistor processes, disposable spacers are usually formed on the substrate to define the position of epitaxy recesses. The disposable spacers are then removed after the epitaxial layer is formed. The above-mentioned process of removing the disposable spacers may damage the top of gate structure or the epitaxial layer, thereby deteriorating the electrical performances of the devices. Accordingly, how to improve the conventional strained silicon transistor process is an essential topic for the nowadays semiconductor industry.

SUMMARY OF THE INVENTION

To improve the above-mentioned conventional method, a novel method of manufacturing strained silicon transistors is provided in the present invention. The approach of the present invention is that the epitaxy process and the source/drain implantation process may be achieved without removing any (disposable) spacer, so the damage to the top of strained silicon transistor device may be efficiently prevented. Furthermore, the position and the width of the source/drain implantation may be independently controlled by a single layer structure.

One object of the present invention is to provide a method of manufacturing a semiconductor device, comprising the steps of providing a substrate having first type semiconductor regions and second type semiconductor regions, forming a first epitaxy mask layer conformally on the gate structures and the substrate, removing a part of the first epitaxy mask layer on the first type semiconductor region and forming first type epitaxial layers in the substrate at both sides of each gate structure in the first type semiconductor region, forming a second epitaxy mask layer conformally on the substrate, wherein said second epitaxy mask layer covers said first epitaxy mask layer on said second type semiconductor regions, forming second type epitaxial layers in the substrate at both sides of each gate structure in the second type semiconductor region, and removing the second epitaxy mask layer.

Another object of the present invention is to provide a method of manufacturing a semiconductor device, comprising the steps of: providing a substrate including strained silicon device regions and non-strained silicon device regions, wherein said strained silicon device regions and non-strained silicon device regions are provided respectively with at least one gate structure; forming an epitaxy mask layer conformally on said gate structures and said substrate; and removing apart of said epitaxy mask layer on strained silicon device regions and forming an epitaxial layer in said substrate at both sides of each said gate structure in said strained silicon device regions.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIGS. 1-12 are cross-sectional views schematically illustrating the process flow of manufacturing a semiconductor device in accordance with the preferred embodiment of the present invention.

Figure 1:
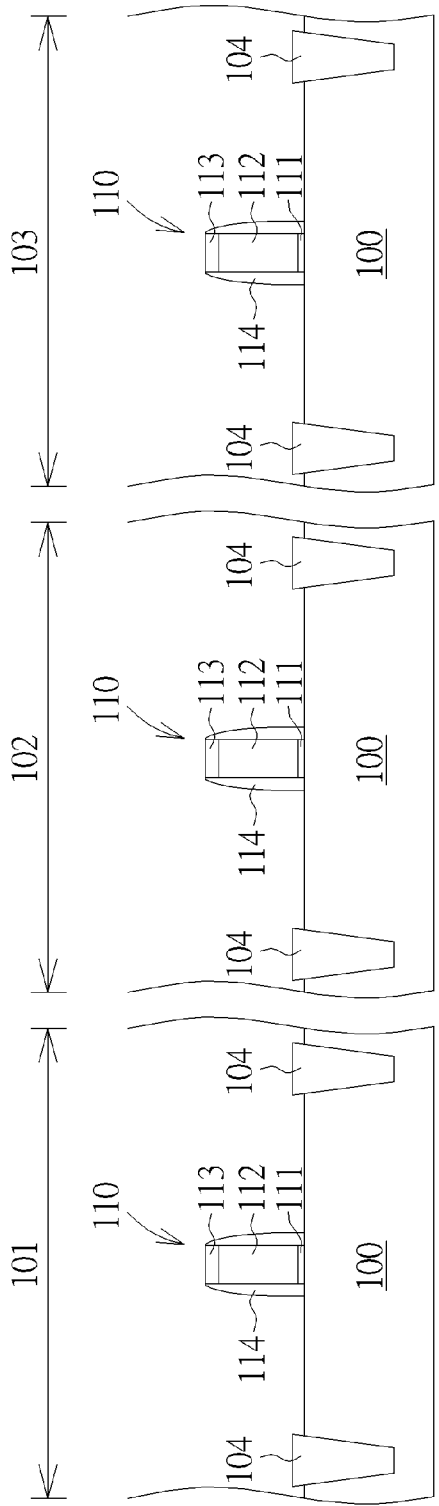

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In following detailed description of the present invention, reference is made to the accompanying drawings which form a part hereof and is shown byway of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims. Unless otherwise defined, all terms (including technical and scientific terms) used herein have the same meaning as commonly understood by one of ordinary skill in the art to which this invention belongs.

The MOS transistor process of the present invention can be applied in a gate-first process, a gate-last for high-k first process or a gate-last for high-k last process etc. Moreover, planar MOS transistors are used as an exemplar embodiment in the following, but it is not limited thereto. The present invention can also be applied to non-planar MOS transistors such as Multi-gate MOSFETs like fin-shaped field effect transistors (FinFET) or tri-gate MOSFETs.

The embodiments will now be explained with reference to the accompanying drawings to describe the process flow of manufacturing semiconductor devices in the present invention, for example, the manufacture of MOS devices. First, please refer to FIG. 1, providing a substrate 100, such as a silicon substrate, a silicon containing substrate, a III-V group-on-silicon (such as GaN-on-silicon) substrate, a graphene-on-silicon substrate or a silicon-on-insulator (SOI) substrate, etc. The substrate 100 includes raised regions and non-raised regions. In the embodiment of present invention, the raised region is a strained silicon device region which may include a first type semiconductor region 101 and a second type semiconductor region 102, such as a PMOS region and a NMOS region which are defined by the ion wells implanted therein respectively. The non-raised region is a non-strained silicon device region which may include a third type semiconductor region 103. Each semiconductor region is isolated by the shallow trench isolations (STI) 104, and is provided with at least one gate structure 110, wherein the gate structure 110 includes a gate dielectric layer 111, a gate 112 disposed on the gate dielectric layer 111, and a cap layer 113 disposed on top of the gate 112. The gate dielectric layer 111 may be composed of a single layer of insulating material such as silicon oxides, silicon nitrides, high-k dielectric material, or a combination thereof ; the gate 16 is composed of conductive materials such as doped or undoped single crystal silicon or polysilicon, silicon germanium, silicides, or other metals; and the cap layer 113 is composed of dielectric material such as silicon nitride or silicon oxide.

Spacers 114 are formed on the sidewall of the gate structure 110, in which the spacer 114 may be composed of material such as silicon nitride. In one embodiment of the present invention, a light ion implantation is then conducted by using the gate structure 110 and the spacer 114 as a mask to implant p-type or n-type dopants into the substrate 100 adjacent to two sides of spacers 114, thereby forming a lightly doped drain (LDD) at two sides of the gate structure 110. For clarity reasons, the LDD portion is omitted in the figure.

Figure 2:
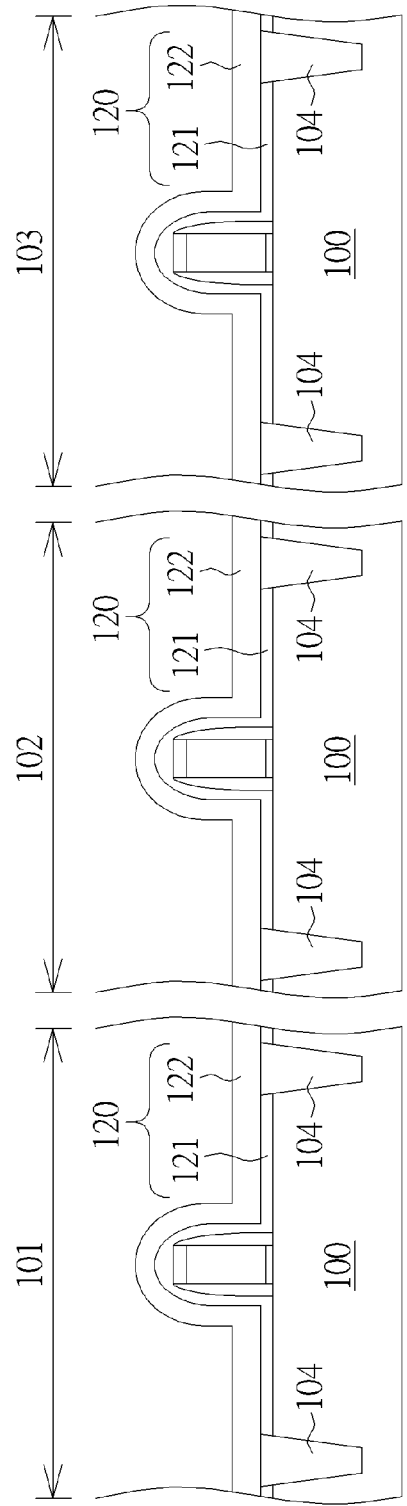

Next, please refer to FIG. 2, an atomic layer chemical vapor deposition (ALCVD) is conducted to form a lower mask layer 121 and an upper mask layer 122 (ex. an oxide layer and a nitride layer) conformally on the gate structure 110 and the substrate 100. In this embodiment, the lower mask layer 121 and upper mask layer 122 are referred together as a first epitaxy mask layer 120, which may be used to prevent the growth of epitaxy layer and to define the position of the epitaxy layer to be formed in following epitaxy process. The lower mask layer 121 may be further used as an etch stop layer. A detailed description will be provided in following embodiment. Preferably, the upper mask layer 122 is formed of SiCN and the lower mask layer 121 is formed of SiO2, and the fabricated lower mask layer 121 has a thickness of 10-50 Angstroms, such as preferably of about 30 Angstroms while the upper mask layer 122 has a thickness of 60-180 Angstroms, preferably of about 120 Angstroms. Alternatively, instead of using SiO2 and SiCN for forming the epitaxy mask layer 120, other precursors that contain chlorine such as dichlorosilane, hexachlorosilane (HCD) or those do not contain chlorine atoms may also be used for forming the upper layer 122, which is also within the scope of the present invention.

Figure 3:
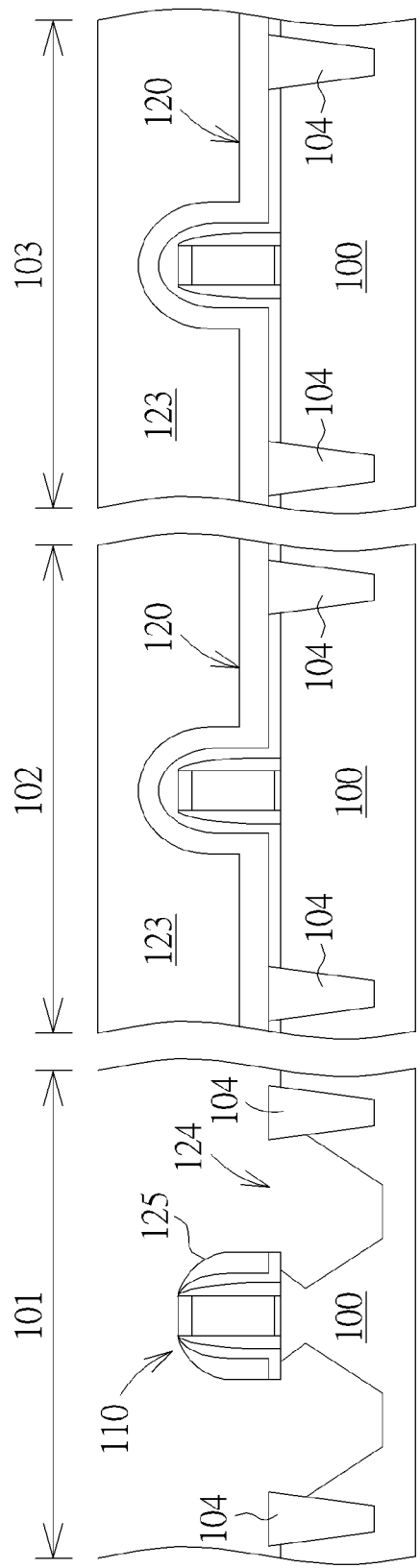

After the first epitaxy mask layer 120 is formed, as shown in FIG. 3, one or more etch processes are performed, such as a dry etching process, a wet etching process or both, to partially remove the first epitaxy mask layer 120, thereby forming epitaxy recesses 124 in the substrate 100 at both sides of the gate structure 110 in the first type semiconductor region 101. The epitaxy recesses 124 are referred hereinafter as first epitaxy recesses. The remaining first type epitaxy mask layer 120 in the first type semiconductor region 101 becomes spacers 125 of the gate structure 110. To elaborate this step, a patterned photoresist layer 123 may be first formed on the second type semiconductor region 102 and third type semiconductor region 103 to expose the first type semiconductor region 101. An etch process is then be performed to etch out a part of the first epitaxy mask layer 120, thereby forming spacers 125 surrounding the gate structure 110 in the first type semiconductor region 101. Next, in the condition that the photoresist layer 123 is selectively removed or is kept, performing a dry etch process, a wet etch process or both to remove a part of the substrate 100 in the first type semiconductor region 101. In this way, the first epitaxy recesses 124 may be selectively formed in the first type semiconductor region 101. In this embodiment of the present invention, the above-mentioned wet etch process uses a NH4OH-based etchant or a TMAH-based etchant which is etch-selective to material of the substrate 100 to further etch the sidewall of the first epitaxy recess 124 formed in the previous step. Since those etchants may etch the silicon substrate 100 along the crystallographic plane <110> and <111>, the first epitaxy recess 124 will be transformed into a recess having distinguishing and specific etch planes, such as diamond-shape facets shown in FIG. 3.

Figure 4:
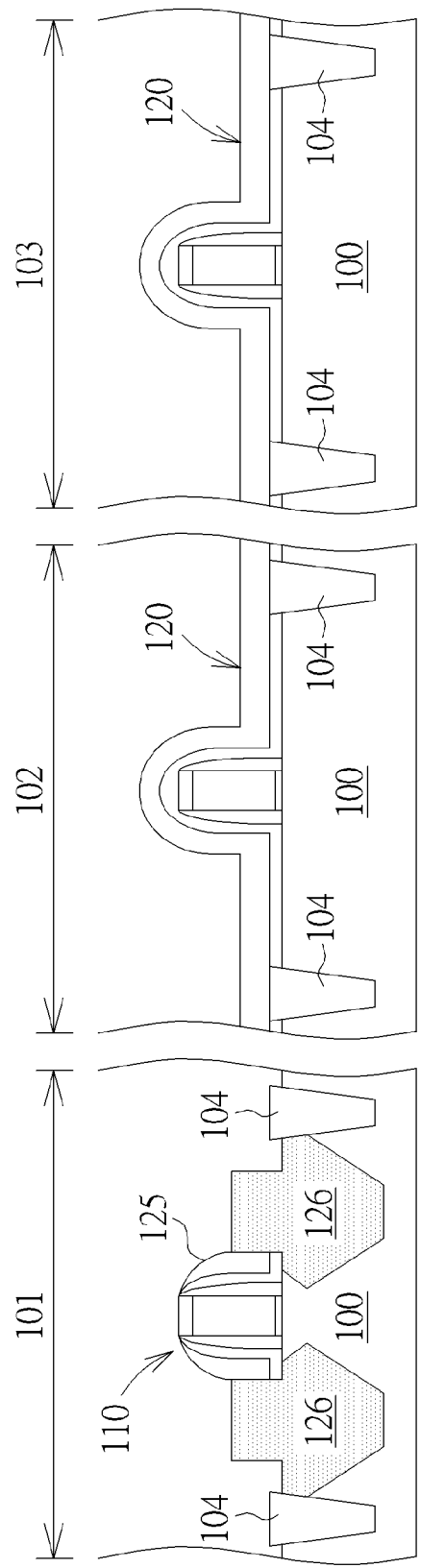

Subsequently, please refer to FIG. 4, a pre-clean process is performed after the photoresist layer 123 is removed. The pre-clean process may be a Standard Clean 1 (SC1) process and/or a process using diluted hydrofluoric acid (DHF) or SPM solution containing sulfuric acid, hydrogen peroxide, and deionized water to remove native oxides or other impurities from the surface of the first epitaxy recesses 124. This step may improve the shape and the cross-sectional structure of the epitaxy layer to be formed in the recess 124 in later processes, so that the fabricated semiconductor device may have better electrical performance. After the recess is cleaned, an epitaxy process is performed. In this stage, since only the portions of the first epitaxy recesses 124 on the substrate 100 are not covered by the first epitaxy mask layer 120, the epitaxial layer 126 is only grown in the first recess 124 in the epitaxy process. In this preferred embodiment, a selective strain scheme (SSS), such as a selective epitaxial growth (SEG) process may be employed to form the epitaxial layer 126, in which the material of the epitaxial layer 126 may be selected depending on the property of transistors. For example, SiGe epitaxial layer may be used in PMOS regions, while SiC, SiP or SiCP epitaxial layer may be used in NMOS regions. The epitaxial layer in the first type semiconductor region 101 is referred hereinafter as first type epitaxial layer 126. As shown in FIG. 4, a first type epitaxial layer 126 fills up the first epitaxy recess 124 and protrudes from the substrate 100 along the spacers 125.

After the first type epitaxial layer 126 is formed on the first type semiconductor region 101, as shown in FIG. 5, a CVD process is performed to form a second epitaxy mask layer 127, such as an oxide layer or a nitride layer, conformally on the substrate 100 without removing the first epitaxy mask layer 120 in the second type semiconductor region 102 and the third type semiconductor region 103. The second epitaxy mask layer 127 is used to prevent the epitaxial layer from growing on the first type semiconductor region 101. Please note that in this step, the spacers 125 in the first type semiconductor region 101 and the first epitaxy mask layer 120 in the second type semiconductor region 102 and the third type semiconductor region 103 are not removed like those conducted in conventional schemes.

Then, as shown in FIG. 6, one or more etch processes are performed, such as a dry etching process, to remove the second epitaxy mask layer 127 in the second type semiconductor region 102 and a part of first epitaxy mask layer 120, thereby forming epitaxy recesses 129 in the substrate 100 at both sides of the gate structure 110 in the second type semiconductor region 102. The epitaxy recess 129 is referred hereinafter as second epitaxy recess. The remaining first type epitaxy mask layer 120 in the second type semiconductor region 102 becomes spacers 130 of the gate structure 110. Similarly, to elaborate this step, a patterned photoresist layer 128 maybe formed on the first type semiconductor region 101 and the third type semiconductor region 103 to expose the second type semiconductor region 102. An etch process is then performed to etch out a part of the second epitaxy mask layer 127 and a part of the first epitaxy mask layer 120, thereby forming spacers 130 surrounding the gate structure 110 in the second type semiconductor region 102. Next, in the condition that the photoresist layer 128 is selectively removed or is kept, performing a dry etch process, a wet etch process or both to remove a part of the substrate 100 in the second type semiconductor region 102. In this way, the second epitaxy recesses 129 may be selectively formed in the second type semiconductor region 102. Unlike the diamond-shape first epitaxy recess 124 shown in FIG. 3, the second epitaxy recess 129 is shallower and is not provided with specific etch facets because no wet etch treatment is applied. Please note that although there is no wet etch process performed in the second type semiconductor region 102 to form specific etch facets in this embodiment, the wet etch process may be alternatively performed to form specific facets.

Figure 7:
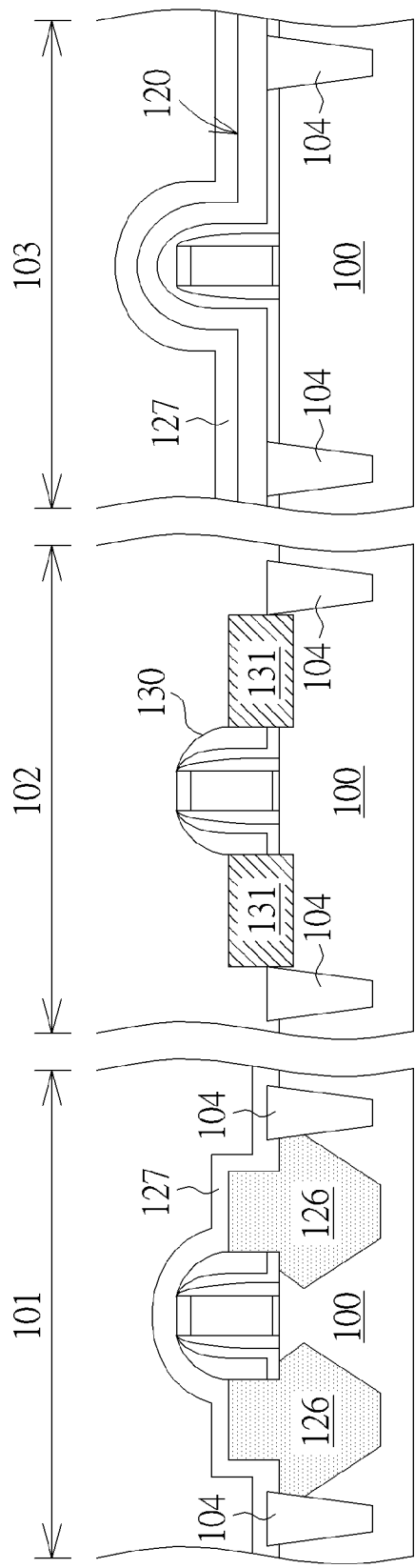

Subsequently, please refer to FIG. 7, an epitaxy process is performed after the photoresist layer 128 is removed. At this stage, since only the portions of second epitaxy recesses 129 on the substrate 100 are not covered by the second epitaxy mask layer 127, the epitaxial layer 131 is only grown in the second recess 129 during the epitaxy process. The epitaxial layer 131 in the second type semiconductor region 102 is referred hereinafter as a second type epitaxial layer. As shown in FIG. 7, the second type epitaxial layer 131 fills up the second epitaxy recess 129 and protrudes from the substrate 100 along the spacers 130. The physical properties of the second type epitaxial layer 131 and the first type epitaxial layer 126 may be the same or different. For example, one of the epitaxial layers is epitaxial SiGe which is specific to the PMOS devices; the other is epitaxial SiC which is specific to the NMOS devices. Alternatively, both of the epitaxial layers are SiGe material or SiC material for forming the PMOS devices or NMOS devices with different electrical performances.

Figure 8:
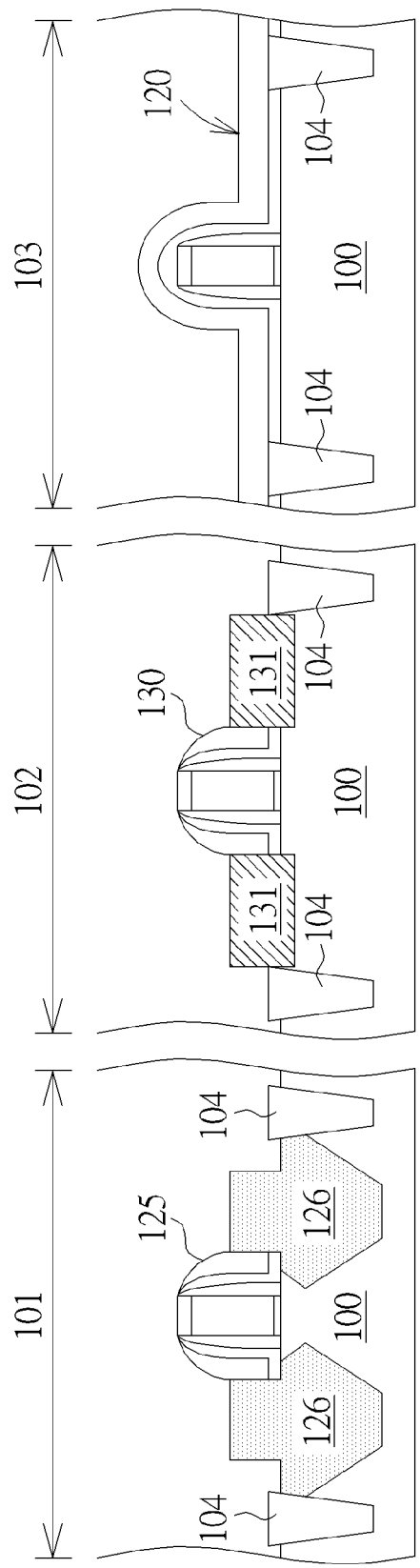

After the second type epitaxial layer 131 is formed, as shown in FIG. 8, the second epitaxy mask layer 127 on the first type semiconductor region 101 and the third type semiconductor region 103 is removed by, for example, a wet etch process using DHF or phosphoric acid, thereby exposing the first type epitaxial layer 126 or the first epitaxy mask layer 120 thereunder. At this stage, only the third semiconductor region 103 is still covered by the first epitaxy mask layer 120. Please note that in this step, the spacers 125 and 130 are not removed, unlike those in conventional process schemes.

Figure 9:
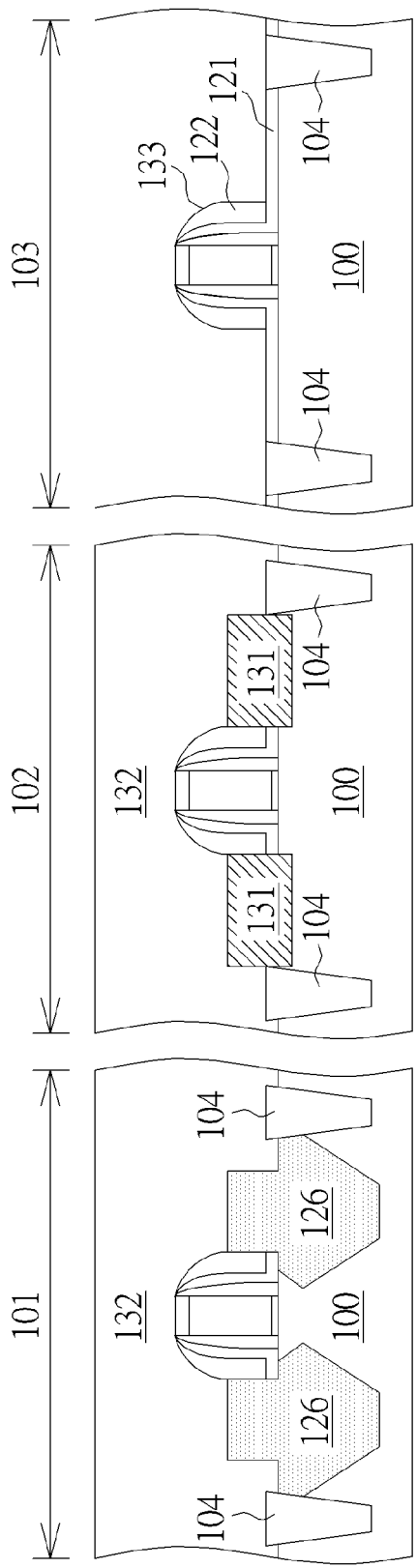

After the second epitaxy mask layer 127 is removed, please refer to FIG. 9, a patterned photoresist layer 132 is formed on the first type semiconductor region 101 and the second type semiconductor region 102 and an etch process is performed on the third semiconductor region 103. During this etch process, the lower mask layer 121 of the first epitaxy mask layer 120 serves as an etch stop layer. In this way, the upper mask layer 122 on the third semiconductor region 103 is partially removed, so that the remaining first epitaxy mask layer 120 becomes spacers 1333 of the gate structure 110 on the third semiconductor region 103. The lower mask layer 121 still remains on the substrate 100 at both sides of the spacers 133, and only the third type semiconductor region 103 is still covered by the lower mask layer 121. The purpose of this etch process is to reduce the thickness of the first epitaxy mask layer 120 on the third semiconductor region 103, so that the following ion implantation process may be properly performed to implant the dopant into the substrate 100 for forming source/drain.

Figure 10:
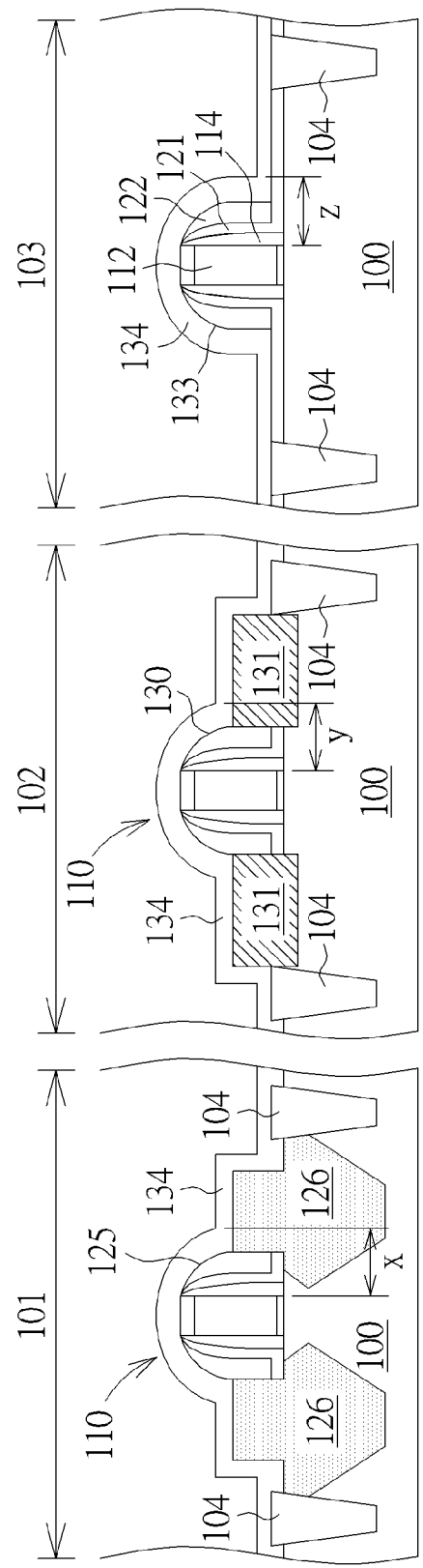

Next, please refer to FIG. 10, a conformal layer 134, such as an oxide layer, is formed on the substrate 100. The conformal layer 134 covers each gate structure 110, spacers 125, 130 and 133, and the epitaxial layer 126 and 131 for defining the position of the source/drain to be formed in the first semiconductor region 101, the second semiconductor region 102 and the third semiconductor region 103 in following ion implantation processes. As shown in FIG. 10, the horizontal distance between the gate 110 and outermost sidewall in the first semiconductor region 101 is the sum of thickness x of the spacer 125 and the conformal layer 134. The horizontal distance between the gate 110 and outermost sidewall in the second semiconductor region 102 is the sum of thickness y of the spacer 130 and the conformal layer 134. The horizontal distance between the gate 110 and the outermost sidewall in the third semiconductor region 103 is the sum of thickness z of the spacer 113 and the conformal layer 134. One advantage of the present invention is that the positions of source/drain in the first, the second and the third type semiconductor regions 101, 102, 103 may be defined independently by controlling the thickness of the upper mask layer 122 and the conformal layer 134. It is unnecessary to remove disposable spacers like in conventional scheme and to form a new real spacer for defining the position of source/drain. The risk of top damage of the gate structure or the epitaxial layers may, therefore, be properly avoided.

After the conformal layer 134 is formed, an ion implantation process is then performed to form source/drain regions in the epitaxial layer or the substrate at both sides of the gate structure. Take CMOS device as an example, the dopants to be implanted for forming the source/drain may be different depending on the type of the devices, i.e. the PMOS device or the NMOS device, thus the P-type dopant implantation and the N-type dopant implantation are performed respectively. In one embodiment of the present invention, the first type semiconductor region 101 may be a strained silicon PMOS device region, the second type semiconductor region 102 may be a strained silicon NMOS device region, and the third type semiconductor region 103 may be a non-strained silicon devices region including both PMOS devices and NMOS devices. For this reason, the third type semiconductor region 103 is divided into a third type semiconductor sub-region 103a and a third type semiconductor sub-region 103b in FIG. 11 and FIG. 12 respectively.

Figures 11, 12:
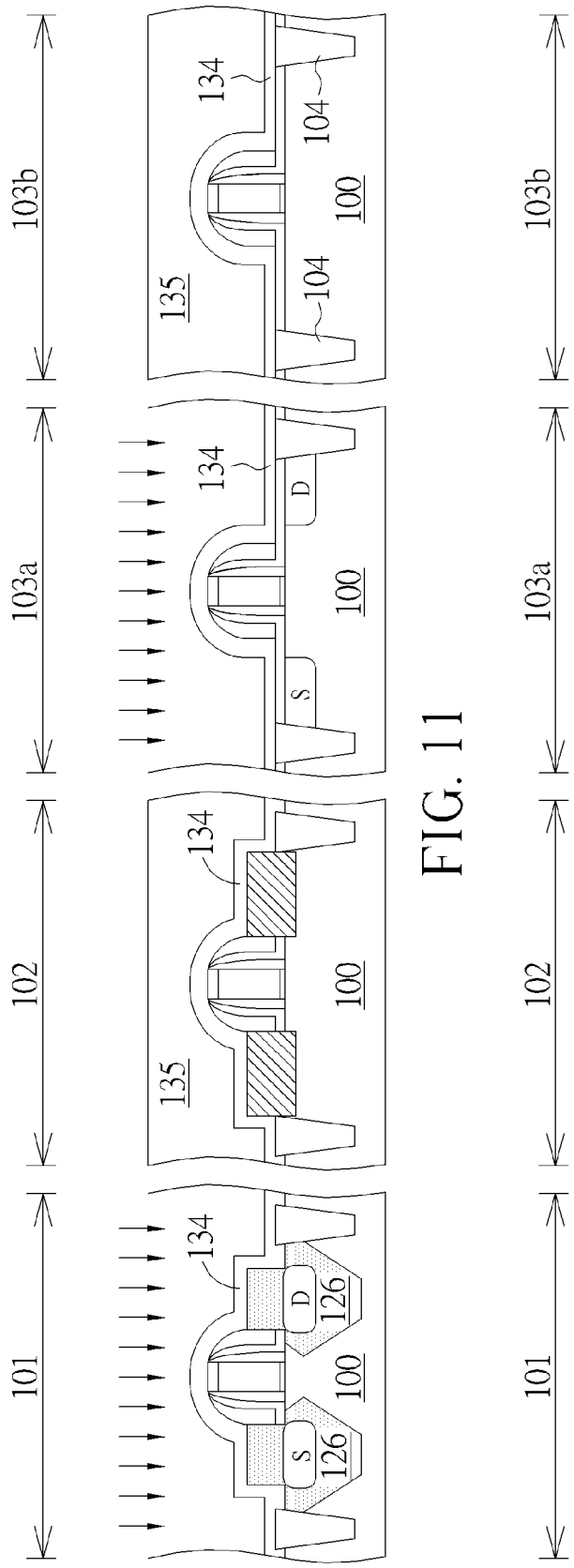

As shown in FIG. 11, the source/drain implantation of the PMOS device regions is first performed by forming a patterned photoresist layer 135 on the NMOS device regions (i.e. the second type semiconductor region 102 and the third type semiconductor sub-region 103b in this embodiment). The ion implantation process is then performed to implant the dopants concurrently into the first type epitaxial layer 126 or the substrate 100 outside the spacers, thereby forming the P-type source/drain regions (S/D).

After the photoresist layer 135 is removed, as shown in FIG. 12, the source/drain implantation of the NMOS device regions is performed by forming a patterned photoresist layer 136 on previous PMOS device regions (i.e. the first type semiconductor region 101 and the third type semiconductor sub-region 103a in this embodiment). The ion implantation process is then performed to implant the dopants concurrently into the second type epitaxial layer 131 or the substrate 100 outside the spacers, thereby forming the N-type source/drain regions (S/D).

After the implantation of the source/drain regions, a stress memorization technology (SMT) may optionally be performed to first perform an ion implant in order to amorphize the exposed silicon material and then form a stress transfer structure (not shown), such as silicon nitride layer containing stress on the surface of the gate structure 110 and the substrate 100, and an anneal process may be conducted to remove the stress transfer structure to increase the ion performances of the device. In this embodiment, the stress transfer structure could either be a tensile stress layer or a compressive stress layer to be applied respectively on the first type semiconductor region 101, the second type semiconductor region 102, the third type semiconductor region 103a, or the third type semiconductor region 103b.

Similar to the aforementioned embodiment of using selective strain scheme for forming epitaxial layer, if the transistor fabricated is an NMOS transistor, a tensile stress layer could be formed on the gate structure and the substrate for carrying out the stress memorization technology. However, if the transistor fabricated is a PMOS transistor, a compressive stress layer could be formed on the gate structure and the substrate for carrying out the stress memorization technology. Since the process of the stress memorization technology is well known to those skilled in the art, the details of which are omitted herein for the sake of brevity.

Thereafter, a replacement metal gate (RMG) process may be optionally performed to replace the poly-Si gate 112 with a metal gate. A salicide process may be performed depending on the process requirement, by sputtering a metal layer (not shown) composed of cobalt, titanium, platinum, palladium, or molybdenum on the epitaxial layer and conducting at least one rapid thermal anneal process (RTP) to have the metal layer react with the epitaxial layer for forming a silicide layer (not shown). A contact etch stop layer (CESL) and an interlayer dielectric layer (ILD) could then be deposited on the substrate 100. Alternatively, the salicide process may be conducted after the ILD layer is formed. For example, after the ILD layer is deposited, the necessary contact hole is first formed by etching the ILD layer to expose the corresponding source/drain region (S/D), then the salicide process is performed. The above-mentioned replacement metal gate process, salicide process, and contact hole process may be conducted in different order depending on the process scheme. As the process for fabricating these elements are well known to those skilled in the art, the details of which are omitted herein for the sake of brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device, comprising the steps of:
   providing a substrate including strained silicon device regions and non-strained silicon device regions, wherein said strained silicon device regions and non-strained silicon device regions are provided respectively with at least one gate structure;
   forming an epitaxy mask layer conformally on said gate structures and said substrate, wherein said epitaxy mask layer further comprises an upper mask layer and a lower mask layer;
   removing a part of said epitaxy mask layer on said strained silicon device regions and forming an epitaxial layer in said substrate at both sides of each said gate structure in said strained silicon device regions;
   forming a photoresist layer on said strained silicon device regions; and
   performing an etch process with said photoresist layer as an etch mask and said lower mask layer as an etch stop layer to remove a part of said epitaxy mask layer on said non-strained silicon device regions, so that the remaining said epitaxy mask layer in said non-strained silicon device regions becomes spacers of said gate structures in said non-strained silicon device regions.

2. The method of manufacturing the semiconductor device according to claim 1, wherein the step of forming said epitaxial layers comprises:
   forming epitaxy recesses in said substrate at both sides of each said gate structure in said strained silicon device regions; and
   forming said epitaxial layer in each said epitaxy recess.

3. The method of manufacturing the semiconductor device according to claim 2, wherein the step of forming said epitaxy recesses comprises:
   forming another photoresist layer on said non-strained silicon device regions; and
   performing another etch process with said another photoresist layer as an etch mask to remove another part of said epitaxy mask layer and a part of said substrate in said strained silicon device regions, thereby forming said epitaxy recesses, and the remaining said epitaxy mask layer in said strained silicon device regions becomes spacers of said gate structures in said strained silicon device regions.

4. The method of manufacturing the semiconductor device according to claim 3, wherein the step of forming said epitaxial layers comprises performing an epitaxial process with said spacers on said strained silicon device regions and said epitaxy mask layer on said non-strained silicon device regions as an epitaxy mask to form said epitaxial layer in each said epitaxy recess.

5. The method of manufacturing the semiconductor device according to claim 1, further comprises:
   forming a conformal layer on said substrate and said gate structures; and
   performing at least one ion implantation process to form source/drain regions respectively at both sides of each said gate structures, wherein said epitaxy mask layer and said conformal layer on sidewalls of said gate structure defines the distance between said gate structure and said source/drain regions.

6. The method of manufacturing the semiconductor device according to claim 1, further comprises:
 forming a conformal layer on said substrate and said gate structures; and
 performing at least one ion implantation process to form source/drain regions respectively at both sides of each said gate structures, wherein said epitaxy mask layer and said conformal layer on sidewalls of said gate structure defines the distance between said gate structure and said source/drain regions.

* * * * *